(12) United States Patent
Domingo

(10) Patent No.: US 11,835,550 B2
(45) Date of Patent: Dec. 5, 2023

(54) POWER CONVERSION, FAULT MANAGEMENT, AND NOTIFICATION

(71) Applicant: Infineon Technologies Austria AG, Villach (AT)

(72) Inventor: Reynaldo Domingo, Spring, TX (US)

(73) Assignee: Infineon Technologies Austria AG, Villach (AT)

( * ) Notice: Subject to any disclaimer, the term of this patent is extended or adjusted under 35 U.S.C. 154(b) by 29 days.

(21) Appl. No.: 17/399,152

(22) Filed: Aug. 11, 2021

(65) Prior Publication Data

US 2023/0051490 A1   Feb. 16, 2023

(51) Int. Cl.
*G01R 31/40* (2020.01)
*H02M 3/155* (2006.01)

(52) U.S. Cl.
CPC ............ *G01R 31/40* (2013.01); *H02M 3/155* (2013.01)

(58) Field of Classification Search
CPC ................................ G01R 31/40; H02M 3/155
See application file for complete search history.

(56) References Cited

U.S. PATENT DOCUMENTS

| | | | |
|---|---|---|---|
| 9,154,039 B2 * | 10/2015 | Li | H02M 3/33507 |
| 2005/0180065 A1 | 8/2005 | Chapuis | |
| 2006/0238204 A1 * | 10/2006 | Swope | G01R 19/16538 |
| | | | 324/522 |
| 2015/0043256 A1 * | 2/2015 | Domingo | H02H 7/1227 |
| | | | 363/52 |
| 2015/0236586 A1 * | 8/2015 | Babazadeh | H02M 1/32 |
| | | | 323/272 |
| 2016/0039290 A1 * | 2/2016 | Mihara | B60L 9/18 |
| | | | 701/22 |
| 2019/0018071 A1 | 1/2019 | Subotski et al. | |
| 2020/0182706 A1 * | 6/2020 | Maruyama | H05K 7/20927 |
| 2023/0088993 A1 * | 3/2023 | Wu | H02M 1/0048 |

FOREIGN PATENT DOCUMENTS

| | | | | |
|---|---|---|---|---|
| CN | 204068695 U | * | 12/2014 | |
| EP | 2369727 A2 | * | 9/2011 | H02J 1/08 |
| EP | 2369727 A2 | | 9/2011 | |
| JP | 3392346 B2 | * | 3/2003 | |
| KR | 20200030954 A | * | 3/2020 | H02J 3/0073 |
| WO | WO-2013023941 A1 | * | 2/2013 | G01R 31/2803 |

OTHER PUBLICATIONS

Extended Search Report, EP 22 18 9505, dated Dec. 9, 2022, pp. 1-9.
Infineon Technologies Ag: "High-Performance DrBLADE TDA21320", Revision 2.4, Jul. 16, 2015 (Jul. 16, 2015), X2055467782, Retrieved from the Internet: URL:https://www.infineon.com/dgdl/Infineon-TDA21320-DS-v02_04-EN.pdf?fileId=5546d462 4933b87501493d06318e4235, [retrieved on Apr. 17, 2018], pp. 1-35.

* cited by examiner

*Primary Examiner* — Son T Le
(74) *Attorney, Agent, or Firm* — Armis IP Law, LLC

(57) ABSTRACT

An apparatus includes a power supply monitor operative to monitor a status of multiple power converters. Based on the monitored status, the power supply monitor detects an event associated with a first power converter of the multiple power converters. The power supply monitor communicates a notification of the event to a management entity. The notification is encoded to include an identity of the first power converter experiencing the event as determined by the power supply monitor or other suitable entity.

32 Claims, 12 Drawing Sheets

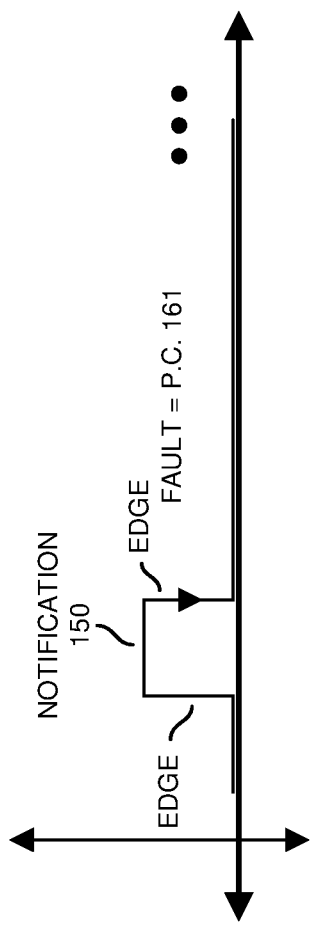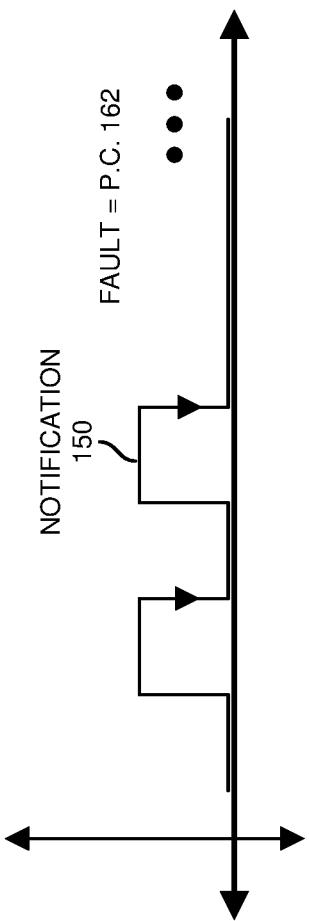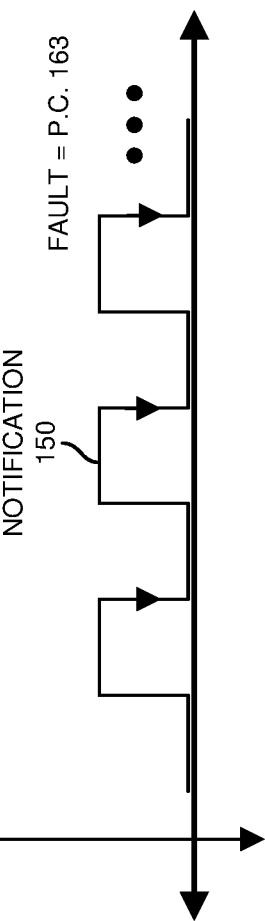

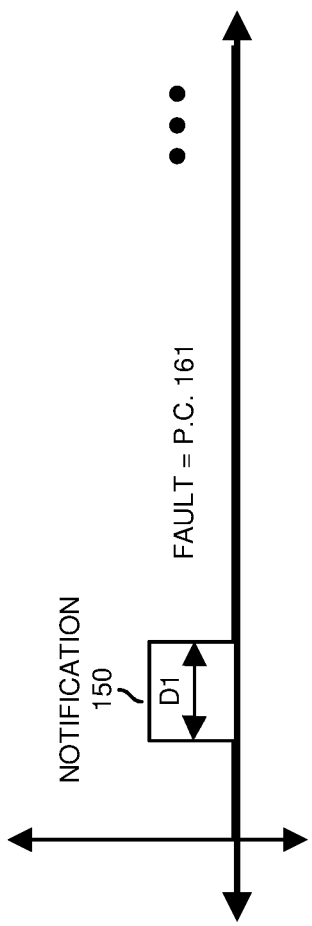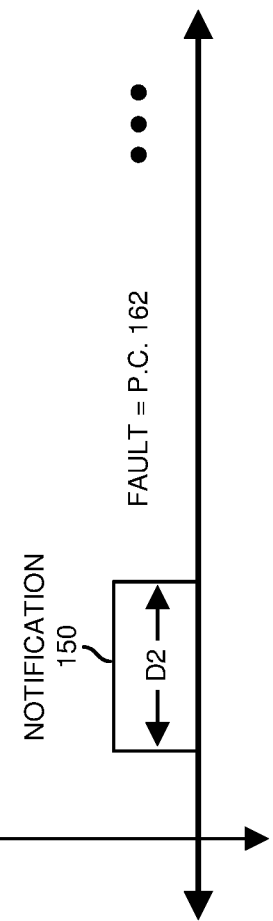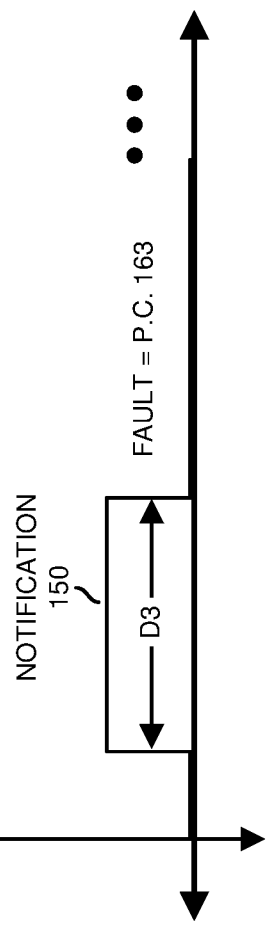

POWER CONVERSION, FAULT MANAGEMENT, AND NOTIFICATION

BACKGROUND

Conventional switched mode power supplies are widely used for converting an input voltage into an output voltage to power a load. For example, in multi-phase and multi-output (or multi-loop) Voltage Regulator Down (VRD) designs for providing power to a CPU/GPU load, due to availability of only a limited number of assignable multi-purpose I/O pins, conventional VRD PWM (Pulse Width Modulation) power supply managers provide just a single FAULT signal to indicate a fault event from any of multiple active loops.

Notification of a single fault may be sufficient for some fault management tasks, but for most computing systems, there is a need to identify which specific loop (voltage regulator) failed in order to better manage a respective multi-regulator power supply system. As a workaround to receiving only insufficient data, computer platform managers have to execute extra steps of sending commands to PWM power supply managers and query for status registers. Adding lines of codes to extract information undesirably imparts an extra burden on a fault manager.

BRIEF DESCRIPTION

Implementation of clean energy (or green technology) is very important to reduce human impact on the environment. In general, clean energy includes any evolving methods and materials to reduce an overall toxicity on the environment from energy consumption.

This disclosure includes the observation that raw energy, such as received from green energy sources or non-green energy sources, typically needs to be converted into an appropriate form (such as desired AC voltage, DC voltage, etc.) before it can be used to power end devices such as servers, computers, mobile communication devices, wireless base stations, etc. In certain instances, energy is stored in a respective one or more battery resource. Alternatively, energy is received from a voltage generator or voltage source.

Regardless of whether energy is received from green energy sources or non-green energy sources, it is desirable to make most efficient use of raw energy (such as storage and subsequent distribution) provided by such sources to reduce our impact on the environment. This disclosure contributes to reducing our carbon footprint and providing better use of energy via more efficient management of providing power conversion.

Embodiments herein include novel ways of providing improved communication of power converter status information to one or more remote management entities.

More specifically, embodiments herein include an apparatus including a power supply monitor. The power supply monitor monitors a status of multiple power converters. Based on the monitored status, the power supply monitor detects an event (such as a failure or other condition) associated with a first power converter of the multiple power converters. The power supply monitor then communicates a notification of the event associated with the first power converter to a management entity. In one embodiment, the notification is encoded to include an identity of the first power converter experiencing the event. The event is a fault caused by a power converter phase in the first power converter.

In further example embodiments, the power supply monitor monitors the status of the multiple power converters via a received feedback signal; a setting of the received feedback signal is collectively controlled by the multiple power converters to provide the status of the multiple power converters. In one embodiment, the monitored status indicates that one of the multiple power converters experiences the event such as a failure.

The notification generated by the power supply monitor or other suitable entity can be encoded in any suitable manner. For example, in one embodiment, the notification can be generated to include a pulse width indicating attributes of the event (such as identity or other parameter) associated with the first power converter. One or more additional or alternative attributes of the notification such as number of edges, voltage magnitude, etc., indicate the identity of the first power converter experiencing the event.

Note further that the power supply monitor can be configured to monitor the status of the multiple power converters in any suitable manner. For example, in one embodiment, the monitored status (such as one or more signals) itself does not indicate that the first power converter experienced the event. The power supply monitor receives additional input such as first feedback. In one embodiment, the first feedback (a first input signal) indicates a current consumption event or other event associated with a first power converter phase in the first power converter. The power supply monitor also receives second feedback (such as a second input signal indicating current consumption associated with a second power converter phase in a second power converter of the multiple power converters. Thus, the second feedback indicates a status of the second power converter phase and second power converter. In one embodiment, the second feedback (second input signal) indicates a non-event associated with the second power converter. The power supply monitor uses a combination of the monitored status of the multiple power converters and the first feedback and the second feedback to determine that the first power converter experiences the event as opposed to the second power converter experiencing the event.

In further example embodiments, the power supply monitor monitors the status of the multiple power converters via a first received signal (such as a status information signal). A setting of the first received signal is collectively controlled by the multiple power converters to provide the status of the multiple power converters. In one embodiment, the voltage level of the first received signal varies depending on a collective status of the multiple power converters.

In further example embodiments, as previously discussed, the power supply monitor can be further configured to: i) receive first feedback from the first power converter, the first feedback indicating a first current consumption status, the first current consumption status associated one or more power converter phases in the first power converter; and ii) receive second feedback from the second power converter, the second feedback indicating a second current consumption status associated with one or more power converter phases in the second power converter, the second current consumption status associated the second power converter. The first feedback and second feedback provide a way to determine which of the power converters experiences a respective failure.

In further example embodiments, the power supply monitor monitors the status of the multiple power converters via a dual purpose feedback signal (such as status information signal). A first setting of the received feedback signal at a first time indicates a first status associated with the multiple power converters prior to the event. A second setting of the received feedback signal indicates a status associated with the multiple power converters during the event.

In still further example embodiments, the first status of the first input signal prior to the event is indicative of a magnitude of a first parameter (such as temperature) or other suitable power supply parameter. The second status of the first input signal during the event is indicative of a magnitude of a second parameter (such as non-temperature) or other suitable power supply parameter.

These and other more specific embodiments are disclosed in more detail below.

Note that although embodiments as discussed herein are applicable to power converters, the concepts disclosed herein may be advantageously applied to any other suitable topologies as well as general power supply control applications.

Note that any of the resources as discussed herein can include one or more computerized devices, mobile communication devices, servers, base stations, wireless communication equipment, communication management systems, workstations, user equipment, handheld or laptop computers, or the like to carry out and/or support any or all of the method operations disclosed herein. In other words, one or more computerized devices or processors can be programmed and/or configured to operate as explained herein to carry out the different embodiments as described herein.

Yet other embodiments herein include software programs to perform the steps and operations summarized above and disclosed in detail below. One such embodiment comprises a computer program product including a non-transitory computer-readable storage medium (i.e., any computer readable hardware storage medium) on which software instructions are encoded for subsequent execution. The instructions, when executed in a computerized device (hardware) having a processor, program and/or cause the processor (hardware) to perform the operations disclosed herein. Such arrangements are typically provided as software, code, instructions, and/or other data (e.g., data structures) arranged or encoded on a non-transitory computer readable storage medium such as an optical medium (e.g., CD-ROM), floppy disk, hard disk, memory stick, memory device, etc., or other a medium such as firmware in one or more ROM, RAM, PROM, etc., or as an Application Specific Integrated Circuit (ASIC), etc. The software or firmware or other such configurations can be installed onto a computerized device to cause the computerized device to perform the techniques explained herein.

Accordingly, embodiments herein are directed to methods, systems, computer program products, etc., that support operations as discussed herein.

One embodiment herein includes a computer readable storage medium and/or system having instructions stored thereon. The instructions, when executed by computer processor hardware, cause the computer processor hardware (such as one or more co-located or disparately located processor devices) to: monitor a status of multiple power converters; based on the monitored status, detect an event associated with a first power converter of the multiple power converters; and communicate a notification of the event to a management entity, the notification encoded to include an identity of the first power converter experiencing the event.

The ordering of the steps above has been added for clarity sake. Note that any of the processing steps as discussed herein can be performed in any suitable order.

Other embodiments of the present disclosure include software programs and/or respective hardware to perform any of the method embodiment steps and operations summarized above and disclosed in detail below.

It is to be understood that the system, method, apparatus, instructions on computer readable storage media, etc., as discussed herein also can be embodied strictly as a software program, firmware, as a hybrid of software, hardware and/or firmware, or as hardware alone such as within a processor (hardware or software), or within an operating system or a within a software application.

As discussed herein, techniques herein are well suited for use in the field of supporting switching power supplies. However, it should be noted that embodiments herein are not limited to use in such applications and that the techniques discussed herein are well suited for other applications as well.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of embodiments herein (BRIEF DESCRIPTION OF EMBODIMENTS) purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section (which is a summary of embodiments as well) and corresponding figures of the present disclosure as further discussed below.

BRIEF DESCRIPTION OF THE DRAWINGS

FIG. 4A is an example diagram illustrating generate of a notification to indicate an event such as a fault condition associated with a first power converter according to embodiments herein.

FIG. 4B is an example diagram illustrating generate of a notification to indicate an event such as a fault condition associated with a second power converter according to embodiments herein.

FIG. 4C is an example diagram illustrating generate of a notification to indicate an event associated with a fault condition associated with a third power converter according to embodiments herein.

FIG. 5A is an example diagram illustrating generate of a notification to indicate a network event such as a fault condition associated with a first power converter according to embodiments herein.

FIG. 5B is an example diagram illustrating generate of a notification to indicate an event such as a fault condition associated with a second power converter according to embodiments herein.

FIG. 5C is an example diagram illustrating generate of a notification to indicate an event such as a fault condition associated with a third power converter according to embodiments herein.

Figure 1:
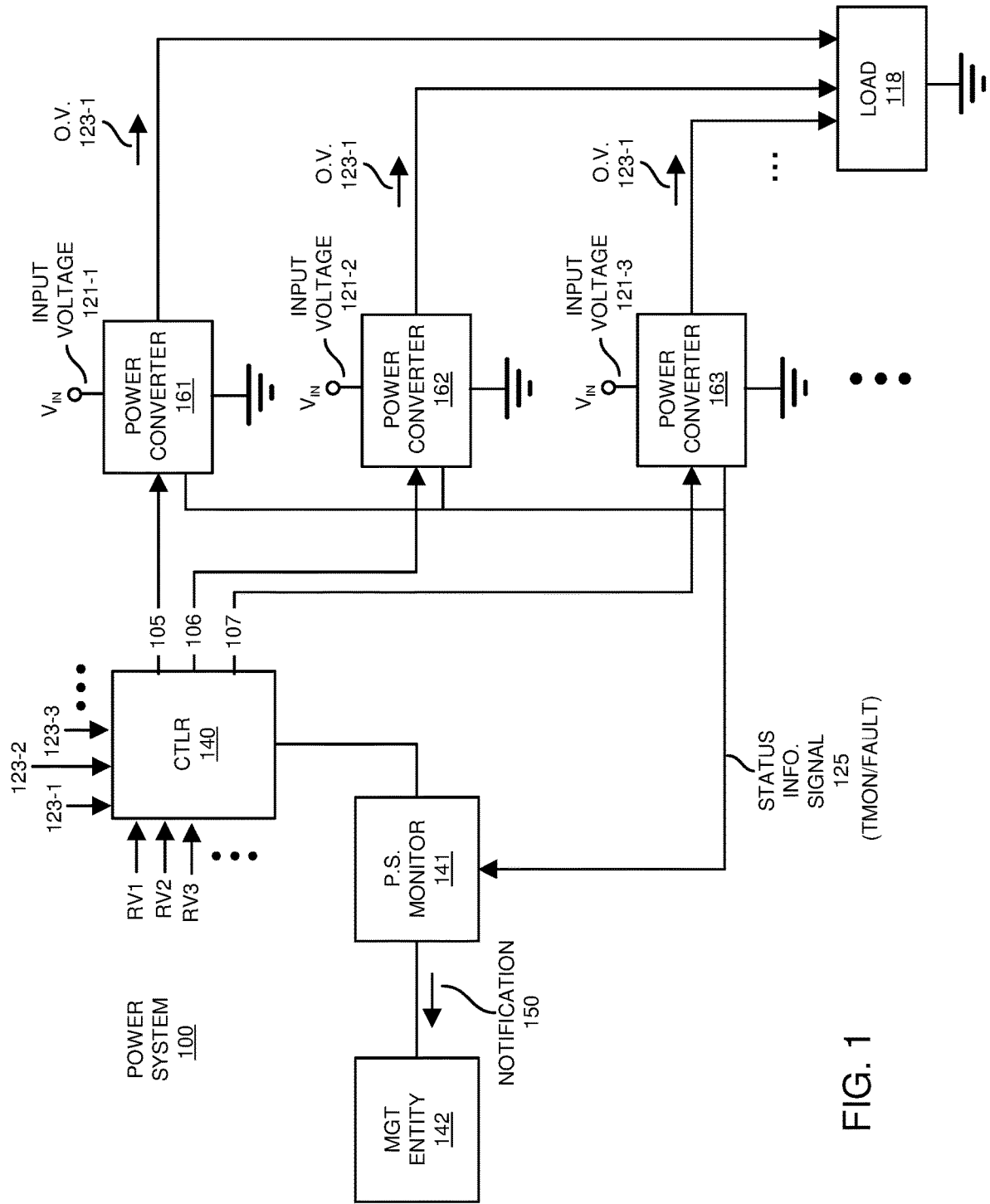
FIG. 1 is an example general diagram of a power supply environment including multiple power converters according to embodiments herein.

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

As previously discussed, a power supply monitor monitors a status (such as via a status information signal) of multiple power converters. Based on the monitored status, the power supply monitor detects a condition such as failure or other event associated with a first power converter of the multiple power converters. The power supply monitor then communicates a notification of the condition to a remotely located management entity. In one embodiment, the notification is encoded to include an identity of the first power converter experiencing the condition. The condition can be any type of event. In one embodiment, the condition is a fault caused by a power converter phase in the first power converter.

In further example embodiments, the power supply monitor monitors the status of the multiple power converters via a dual purpose feedback signal (such as a status information signal, which may be implemented as a TMON/FAULT signal); a setting of the dual purpose feedback signal is collectively controlled over time by the multiple power converters to provide the status of the multiple power converters. In one embodiment, the monitored status indicates that one of the multiple power converters experiences a failure condition. For example, a first setting of the received feedback signal prior to the condition indicates at a first instance of time a first status associated with the multiple power converters such as a maximum temperature of the power converters. A second setting of the received feedback signal during the condition indicates that one of the multiple power converters is failing.

Now, more specifically, FIG. 1 is an example general diagram of a power supply and corresponding power supply monitor start manager according to embodiments herein.

In this example embodiment, as shown, the power system 100 includes controller 140, power supply monitor 141, management entity 142, power converter 161, power converter 162, power converter 163, etc., and dynamic load 118.

Each of the power converters can be configured in any suitable manner to produce a respective voltage to power the dynamic load 118. In one embodiment, the power supply monitor 141 resides in controller 140. Additionally, or alternatively, the power supply monitor 141 (such as circuitry) is disparately located with respect to the controller 140.

As further shown, during operation, the controller 140 controls switching of the power converters to convert a respective one or more input voltages into one or more output voltages supplied to the dynamic load 118.

In further example embodiments, the dynamic load 118 or other suitable entity provides setpoint information indicating a respective magnitude in which to regulate a corresponding output voltage produced by a respective power converter. For example, the dynamic load 118, controller 140, or other suitable entity: i) generates the setpoint reference voltage RV1 supplied to the power converter 161; ii) generates the setpoint reference voltage RV2 supplied to the power converter 162; iii) generates the setpoint reference voltage RV3 supplied to the power converter 163; and so on.

As further discussed herein, the setpoint reference voltages RV1, RV2, etc., control a magnitude at which the different power converters produce a respective output voltage For example, based on monitoring the magnitude of the output voltage 123-1 (or other suitable one or more parameters), the controller 140 produces control signals 105 to convert the input voltage 121-1 into the output voltage 123-1 supplied to power the dynamic load 118. In one embodiment, the power converter 161 is a voltage regulator operative to produce the output voltage 123-1 with respect to setpoint reference voltage RV1.

Based on monitoring the magnitude of the output voltage 123-2 (or other suitable one or more parameters), the controller 140 produces control signals 106 to convert the input voltage 121-2 into the output voltage 123-2 supplied to power the dynamic load 118. In one embodiment, the power converter 162 is a voltage regulator operative to produce the output voltage 123-1 with respect to a setpoint reference voltage RV2.

Based on monitoring the magnitude of the output voltage 123-3 (or other suitable one or more parameters), the controller 140 produces control signals 107 to convert the input voltage 121-3 into the output voltage 123-3 supplied to power the dynamic load 118. In one embodiment, the power converter 163 is a voltage regulator operative to produce the output voltage 123-3 with respect to a setpoint reference voltage RV3.

In further example embodiments, the power supply monitor 141 monitors the status of the multiple power converters via a received status information signal 125 (such as a feedback signal of status information). In one embodiment, a setting of the received status information signal 125 is collectively controlled by the multiple power converters 161, 162, 163, etc., to provide the status information of the multiple power converters to the power supply monitor 141.

In one embodiment, the monitored status received from the feedback signal 125 indicates when one or more of the multiple power converters experiences an event such as a failure.

Thus, as its name suggests, the power supply monitor 141 monitors a status of multiple power converters 161, 162, 163, etc., via at least the status information signal 125 (such as TMON/Fault signal). Based on the monitored status, the power supply monitor 141 detects occurrence of one or more failures associated with the power converters and generates notifications of same. For example, assume that the power supply monitor 141 detects a failure associated with a first power converter 161 of the multiple power converters. In such an instance, the power supply monitor 141 then generates and communicates a notification 150 of the failure (or other information such as status information 125) to a management entity 142 overseeing health status of the power converters.

In further example embodiments, note that the management entity is disposed in the dynamic load 118 or other suitable location.

In still further example embodiments, the notification 115 is encoded to include an identity of the specific power converter experiencing the failure (such as event). The failure can be any condition. In one embodiment, the failure is a fault condition associated with a specific power converter phase.

In one embodiment, via the notification 150, the management entity 142 is notified of the specific power converter that experiences a failure but not the specific power converter phase of multiple power converter phases in the specific power converter. Although, if desired, note that the power supply monitor 141 can be configured to produce the notification 150 to indicate the power converter that fails as well as the corresponding specific power converter phase in that failing power converter.

Figure 2:
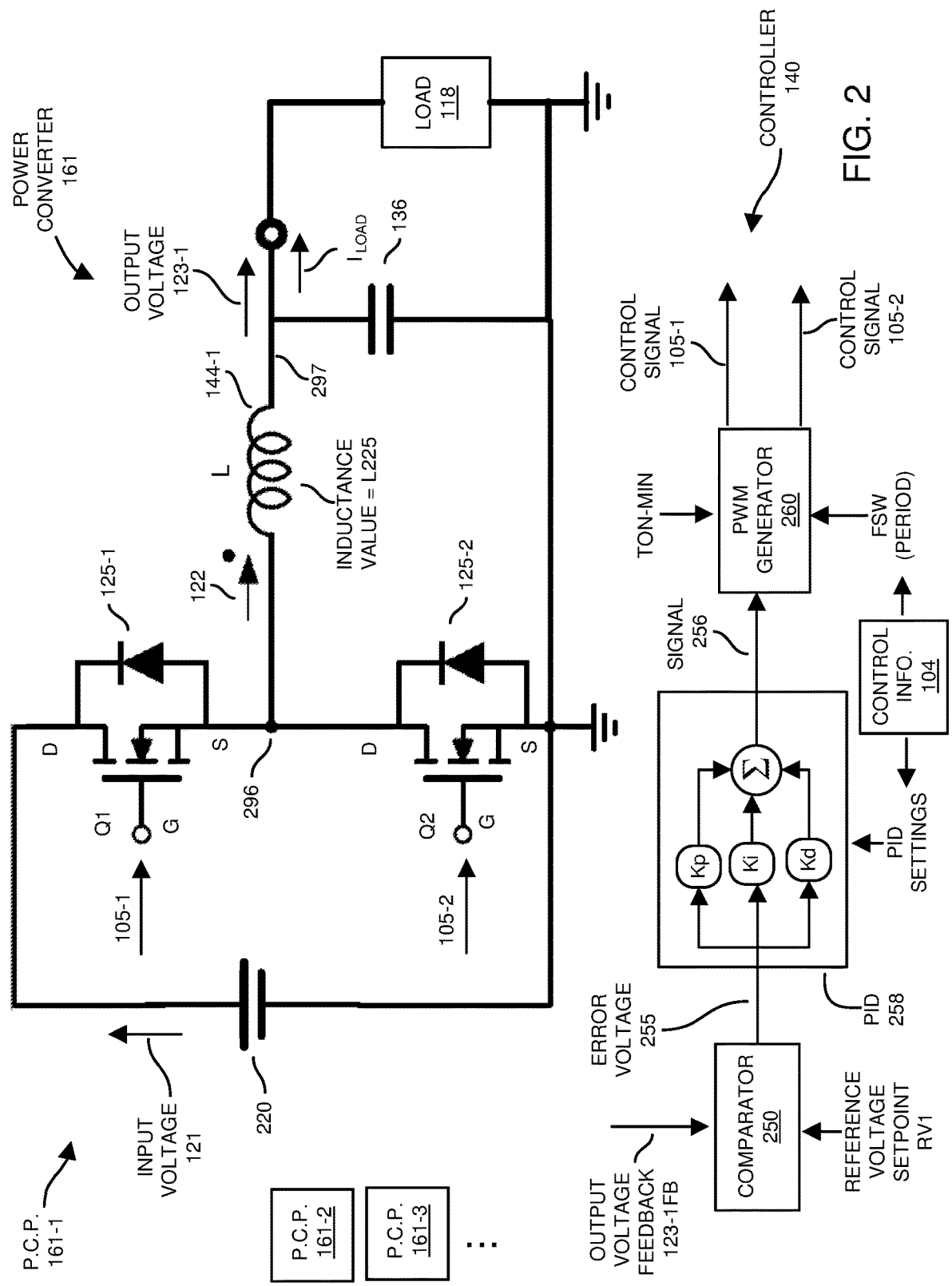
FIG. 2 is a detailed diagram illustrating an example power converter phase and switch control according to embodiments herein.

FIG. 2 is an example diagram illustrating operation of a power converter and generation of an output voltage according to embodiments herein.

As previously discussed, the power converters 161, 162, 163, etc., and corresponding power system 100 can be configured as any suitable type of power converter or power converter system.

In this non-limiting example embodiment, the power converter 161 includes multiple power converter phases such as power converter phase 161-1, power converter phase 161-2, power converter phase 161-3, etc. In a similar manner, each of the power converters 162, 163, etc., can be configured to include multiple power converter phases.

In this example embodiment, the power converter phase 161-1 is configured as a buck converter. In such an instance, the power converter phase 161-1 includes voltage source 220 (providing input voltage 121-1), switch Q1 (high side switch circuitry 125-1), switch Q2 (low side switch circuitry 125-2), inductor 144-1, and output capacitor 136 (such as one or more capacitors).

Note that the switches 125 (Q1, Q2, etc.) can be implemented in any suitable manner. In one embodiment, each of the switches 125 is a so-called field effect transistor. Any suitable type of switches 125 can be used to provide switching as discussed herein.

Although the power converter 161 (including multiple power converter phases) in FIG. 2 is shown as a buck converter configuration, note again that the power converter 165 can be instantiated as any suitable type of voltage converter and include any number of phases, providing regulation of a respective output voltage 123-1 as described herein.

As further shown in this example embodiment, the switch Q1 of power converter 161 is connected in series with switch Q2 between the input voltage source 220 and corresponding ground reference.

For example, the drain node (D) of the switch Q1 is connected to the voltage source 220 to receive input voltage 121. The switch controller 140 drives the gate node (G) of switch Q1 with control signal 105-1.

The source node (S) of the switch Q1 is connected to the drain node (D) of the switch Q2 at node 296. The switch controller 140 drives the gate node (G) of switch Q2 with control signal 105-2. The source node (S) of the switch Q2 is connected to ground.

As previously discussed, the power converter 165-1 further includes inductor 144-1. Inductor 144-1 extends from the node 296 to node 297 of the output capacitor 136 and dynamic load 118.

Via switching of the switches Q1 and Q2 via respective control signal 105-1 (applied to gate G of switch Q1) and control signal 105-2 (applied to gate G of switch Q2), the node 296 coupling the source (S) node of switch Q1 and the drain (D) node of switch Q2 provides output current through the inductor 144-1, resulting in generation of the output voltage 123-1 and corresponding output current $I_{LOAD}$ powering the load 118 and energizing capacitors 136.

In general, the magnitude of the current $I_{LOAD}$ is equal to a magnitude of the output current through inductor 144-1. Output capacitor 136 reduces a ripple voltage associated with the output voltage 123-1.

In further example embodiments, as previously discussed, the controller 140 controls switching of the switches Q1 and Q2 based on one or more feedback parameters. For example, the controller 140 can be configured to receive output voltage feedback signal 123-1FB derived from the output voltage 123-1 supplied to power the load 118 as previously discussed in FIG. 1. The output voltage feedback signal 123-1FB can be the output voltage 123-1 itself or a proportional derivative voltage value thereof using a resistor divider.

Referring again to FIG. 2, via the comparator 250, the controller 140 compares the output voltage feedback signal 123-1FB (such as output voltage 123 itself or derivative, or proportional signal) to the reference voltage setpoint RV1, a magnitude of which may be controlled by the dynamic load 118.

As previously discussed, the reference voltage setpoint RV1 is a desired setpoint in which to control a magnitude of the output voltage 123-1 during load-line regulation implemented by the power system 100.

In one embodiment, a voltage manager in or associated with the dynamic load 118 provides control information (such as via a respective VID value) indicating a desired reference voltage setpoint RV1. In other words, the voltage manager of the dynamic load 118 can be configured to provide feedback to the controller 140 indicating a magnitude in which to produce the output voltage 123-1. In further example embodiments, the feedback such as VID value is used to produce the reference voltage RV1.

As further shown, the amplifier or comparator 250 produces a respective error voltage 255 based on a difference between the output voltage feedback signal 123-1 and the reference voltage RV1. A magnitude of the error voltage 255 generated by the amplifier or comparator 250 varies depending upon the degree to which the magnitude of the output voltage 123-1 is in or out of regulation (with respect to the reference voltage setpoint RV1).

In one non-limiting example embodiment, the controller 140 includes PID controller 258 (control function). The PID controller 258 includes one or more of a P-component (Proportional component), I-component (Integral component), and a D-component (Derivative component) as known in the art to control operation of switches 125 (Q1 and Q2). In voltage mode control, the output of the PID can proportionally control the duty cycle or ON-time of the PWM, and the PWM pulses may be generated at a fixed or variable switching period or frequency. In current mode control, the output of the PID sets the target average current or peak current in the inductor 144-1, and the PWM pulse is dependent on the current sense information, such that the duty cycle or ON time of the PWM is generated based on the PID output and the current sense, with the PWM pulses being generated at fixed or variable switching period or frequency.

In further example embodiments, the control information 104 includes PID settings (so-called tuning parameters such as gain value Kp applied to the P-component stage, a gain value Ki applied to the I-component stage, and a gain value Kd applied to the D-component stage) produced by the soft start manager 141. Note that the PID settings (gain value Kp, gain value Ki, gain value Kd) vary depending on the conditions associated with producing the output voltage 123-1.

As further shown, the PWM (Pulse Width Modulation) generator 260 of the controller 140 controls operation of switching the switches Q1 and Q2 based upon the magnitude of the signal 256 (such as control output) from the PID controller 258.

For example, in general, if the error voltage 255 (and control signal 256) indicates that the output voltage 123-1 (of the power converter 165-1) becomes less than a magnitude of the reference voltage setpoint RV1, the PWM generator 260 increases a duty cycle or frequency of activating the high side switch Q1 (thus decreasing a duty cycle of activating the low-side switch Q2) in a respective switch control cycle.

Conversely, if the error voltage 256 indicates that the output voltage 123-1 (of the power converter 165-1) becomes greater than a magnitude of the reference voltage setpoint RV1, the PWM generator 260 decreases a duty cycle or frequency of activating the high side switch circuitry Q1 (thus increasing a duty cycle of activating the low-side switch Q2) in a respective switching control cycle.

As is known in the art, the controller 140 controls each of the switches Q1 and Q2 ON and OFF at different times to prevent short-circuiting of the input voltage 121-1 to the ground reference voltage. For example, for a first portion of the control cycle, when the switch Q1 is activated to an ON state, the switch Q2 is deactivated to an OFF state. Conversely, when the switch Q1 is deactivated to an OFF state, the switch Q2 is activated to an ON state.

Note that the controller 140 (via PWM generator 260) implements a dead time (both switches Q1 and Q2 OFF) between state ON-OFF and OFF-ON state transitions to prevent shorting of the input voltage 121-1 to the ground reference.

Via variations in the pulse with modulation (and/or frequency modulation) of controlling the respective switches Q1 and Q2, the controller 140 controls generation of the output voltage 123-1 such that the output voltage 123-1 remains within a desired voltage range with respect to the reference voltage setpoint RV1.

The magnitude of current through the inductor 144-1 supplied to the dynamic load 118 increases when the high-side switch Q1 (such as one or more field effect transistor or other suitable component) is ON and low-side switch Q2 (such as one or more field effect transistor or other suitable component) is OFF; the magnitude of current through the inductor 144-1 to the load 118 decreases when the high-side switch Q1 is OFF and Q2 is ON.

Each of the power converter phases associated with the power converter 161 operates in a similar manner as the power converter phase 161-1.

Each of the multiple power converters 162, 163, etc., is configured to implement multiple power converter phases as power converter 161.

Figure 3:
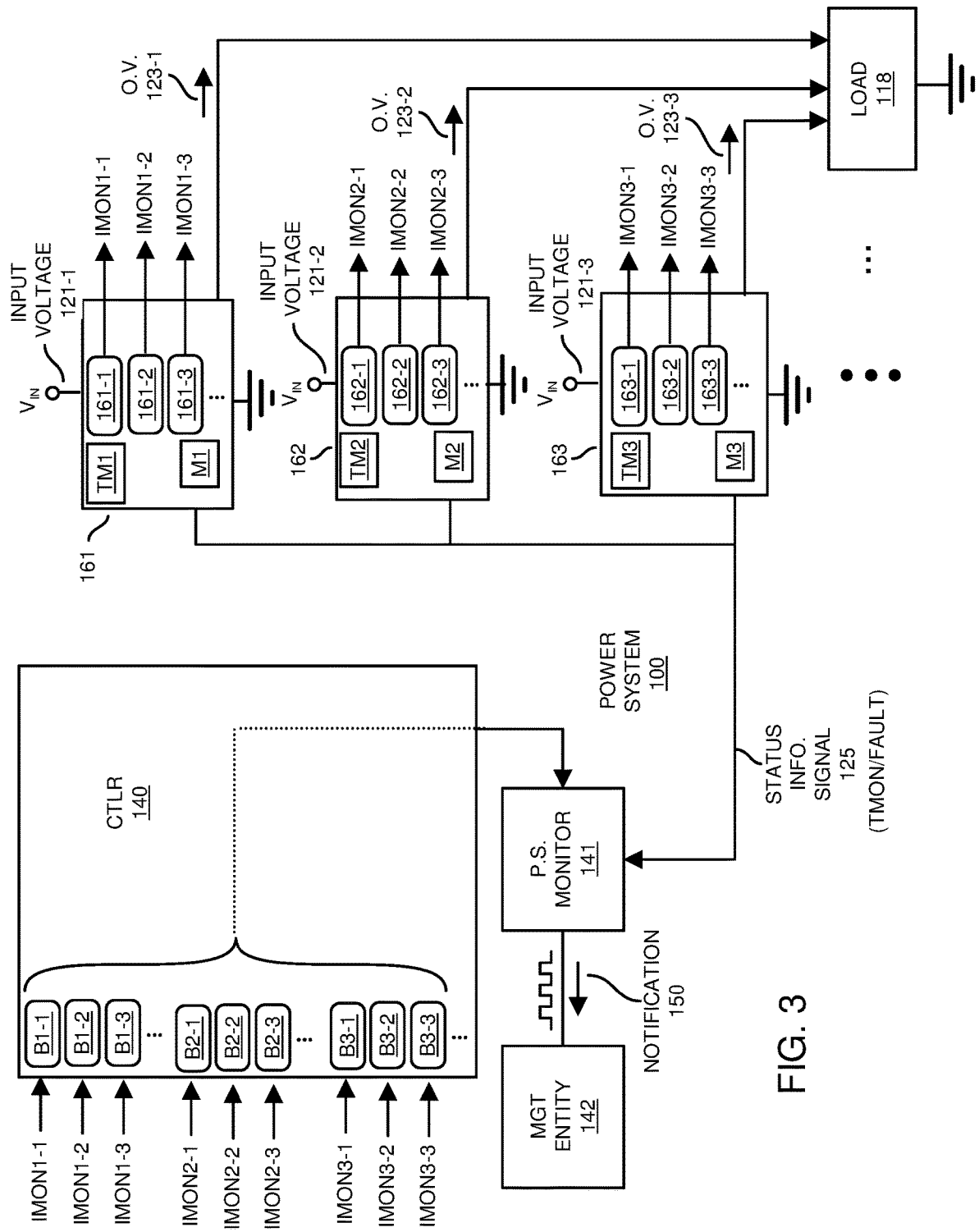
FIG. 3 is an example diagram illustrating a power supply monitor and generation of a notification according to embodiments herein.

FIG. 3 is an example diagram illustrating a power supply monitor and generation of a notification according to embodiments herein.

In further example embodiments, the power supply monitor 141 monitors the status of the multiple power converters 161, 162, 163, etc., via a dual purpose feedback signal, namely, status information signal 125.

For example, power converter 161-1 includes temperature monitor TM1 and fault monitor M1. As its name suggests, the temperature monitor TM1 monitors a respective temperature of the power converter 121-1 and/or corresponding components. Fault monitor M1 monitors the power converter 161-1 for faults. If there are no faults detected by the fault monitor M1, the temperature monitor TM1 outputs an analog temperature signal to the status information signal 125. If a fault condition is detected in the power converter 161, the fault monitor M1 drives the status information signal 125 with a logic high voltage level.

In a similar manner, power converter 161-2 includes temperature monitor TM2 and fault monitor M2. As its name suggests, the temperature monitor TM2 monitors a respective temperature of the power converter 121-2 and/or corresponding components. Fault monitor M2 monitors the power converter 161-2 for faults. If there are no faults detected by the fault monitor M2, the temperature monitor TM2 outputs an analog temperature signal to the status information signal 125. If a fault condition is detected in the power converter 161-2, the fault monitor M2 drives the status information signal 125 with a logic high voltage level.

In a similar manner, power converter 161-3 includes temperature monitor TM3 and fault monitor M3. As its name suggests, the temperature monitor TM3 monitors a respective temperature of the power converter 121-3 and/or corresponding components. Fault monitor M3 monitors the power converter 161-3 for faults. If there are no faults detected by the fault monitor M3, the temperature monitor TM3 outputs an analog temperature signal to the status information signal 125. If a fault condition is detected in the power converter 161-3, the fault monitor M2 drives the status information signal 125 with a logic high voltage level.

Figure 7:
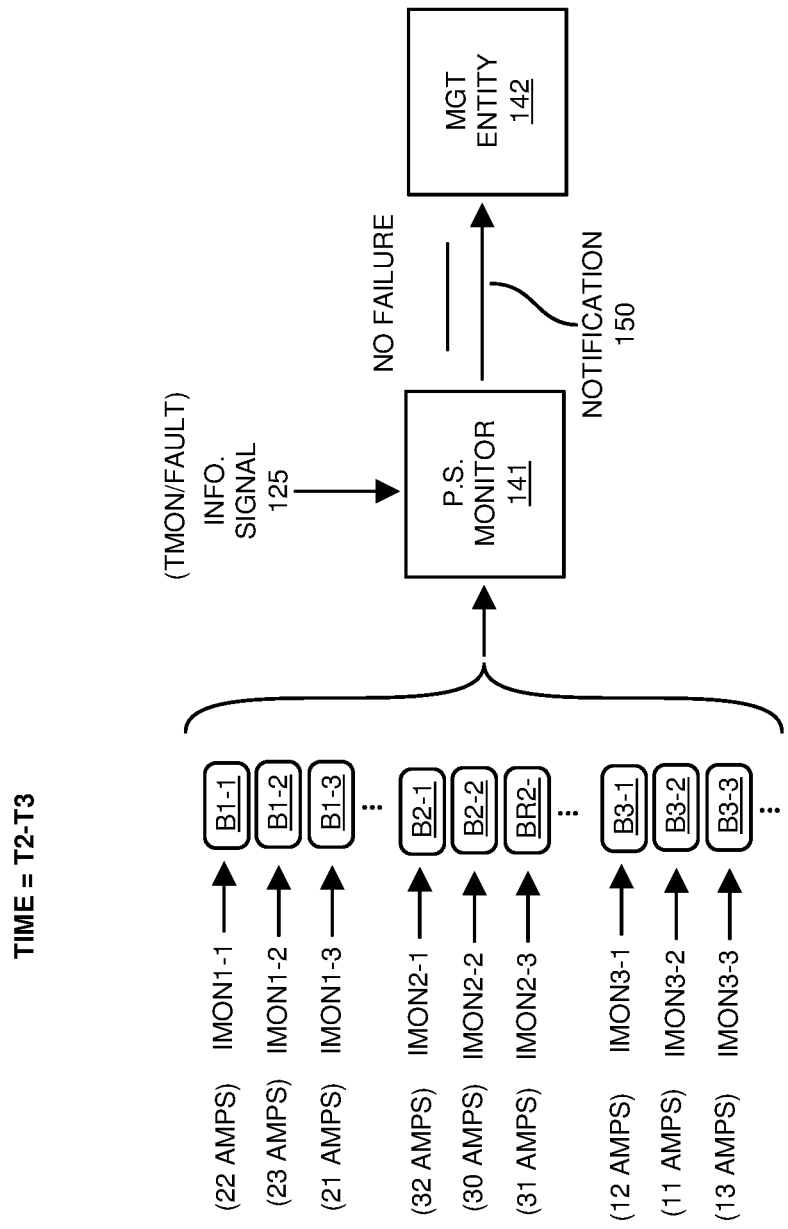
FIG. 7 is an example diagram illustrating a power supply monitor and absence of generating notification of a fault condition according to embodiments herein.

In one embodiment, the status information signal 125 is a single signal conveyed over a single electrically conductive path connected between the power converters and the controller 140/power supply monitor 141. If no failure is detected, the fault monitors do not drive the status information signal 125 and the status information signal 125 conveys a voltage value indicative of a maximum temperature (highest voltage) driven by a respective temperature monitor. During a failure, one or more of the fault monitors M1, M2, M3, etc., drive the status information signal 125 to a logic high, there is no longer conveyance of temperature information associated with any of the temperature monitors to the power supply monitor 141. Additional details of this embodiment are shown in FIG. 7.

Referring again to FIG. 3, in one embodiment, the status information signal 125 itself does not indicate which of the power converters experiences a respective failure during a fault condition. However, as further shown in FIG. 3, each of the power converters supplies respective output current information (IMON) supplied from each respective power converter phase of the power converter to the dynamic load 118. The power supply monitor 141 uses such information as a basis to determine which of the one or more multiple power converters or power converter phases experiences a respective failure More specifically, the first power converter phase 161-1 of the power converter 161 supplies output current to produce the output voltage 123-1. The power converter phase 161-1 supplies status information IMON1-1 indicating an amount of current supplied by the power converter phase 161-1 to produce the output voltage 123-1. The power converter phase 161-1 supplies the status information IMON1-1 to controller 140; each sample of the status information IMON1-1 is stored in buffer B1-1 (such as memory, register, etc.).

The second power converter phase 161-2 of the power converter 161 supplies output current to produce the output voltage 123-1. The power converter phase 161-2 supplies feedback status information IMON1-2 indicating an amount of current supplied by the power converter phase 161-2 to produce the output voltage 123-1. The power converter phase 161-2 supplies the status information IMON1-2 to controller 140; each sample of the status information IMON1-2 is stored in buffer B1-1 (such as memory, register, etc.).

The third power converter phase 161-3 of the power converter 161 supplies output current to produce the output voltage 123-3. The power converter phase 161-3 supplies feedback status information IMON1-3 indicating an amount of current supplied by the power converter phase 161-3 to produce the output voltage 123-1. The power converter phase 161-3 supplies the status information IMON1-3 to controller 140; each sample of the status information IMON1-3 is stored in buffer B1-3 (such as memory, register, etc.).

The first power converter phase 162-1 of the power converter 162 supplies output current to produce the output voltage 123-2. The power converter phase 162-1 supplies status information IMON2-1 indicating an amount of current supplied by the power converter phase 162-1 to produce the output voltage 123-2. The power converter phase 162-1 supplies the status information IMON2-1 to controller 140; each sample of the status information IMON2-1 is stored in buffer B2-1 (such as memory, register, etc.).

The second power converter phase 162-2 of the power converter 162 supplies output current to produce the output voltage 123-2. The power converter phase 162-2 supplies status information IMON2-2 indicating an amount of current supplied by the power converter phase 162-2 to produce the output voltage 123-2. The power converter phase 162-2 supplies the status information IMON2-2 to controller 140; each sample of the status information IMON2-2 is stored in buffer B2-2 (such as memory, register, etc.).

The third power converter phase 162-3 of the power converter phase 162 supplies output current to produce the output voltage 123-2. The power converter phase 162-3 supplies status information IMON2-3 indicating an amount of current supplied by the power converter phase 162-3 to produce the output voltage 123-3. The power converter phase 162-3 supplies the status information IMON2-3 to controller 140; each sample of the status information IMON2-3 is stored in buffer B2-3 (such as memory, register, etc.).

The first power converter phase 163-1 of the power converter 163 supplies output current to produce the output voltage 123-3. The power converter phase 163-1 supplies status information IMON3-1 indicating an amount of current supplied by the power converter phase 163-1 to produce the output voltage 123-3. The power converter phase 163-1 supplies the status information IMON3-1 to controller 140; each sample of the status information IMON3-1 is stored in buffer B3-1 (such as memory, register, etc.).

The second power converter phase 163-2 of the power converter 163 supplies output current to produce the output voltage 123-3. The power converter phase 163-2 supplies feedback status information IMON3-2 indicating an amount of current supplied by the power converter phase 163-2 to produce the output voltage 123-3. The power converter phase 163-2 supplies the status information IMON3-2 to controller 140; each sample of the status information IMON3-2 is stored in buffer B3-2 (such as memory, register, etc.).

The third power converter phase 163-3 of the power converter phase 163 supplies output current to produce the output voltage 123-3. The power converter phase 163-3 supplies status information IMON3-3 indicating an amount of current supplied by the power converter phase 163-3 to produce the output voltage 123-3. The power converter phase 163-3 supplies the status information IMON3-3 to controller 140; each sample of the status information IMON3-3 is stored in buffer B3-3 (such as memory, register, etc.).

In one embodiment, the controller 140 uses the received IMON information to produce respective control signals that control operate of the power converters.

In further example embodiments, the power supply monitor 141 uses the received current feedback information (IMON status information) stored in buffers of controller 140 to determine which of the respective power converters or corresponding power converter phases most likely caused the fault condition as indicated by the status information signal 125. Additional details are discussed in FIGS. 6-9.

FIG. 4A is an example diagram illustrating generation of a notification to indicate an event such as a fault condition associated with a first power converter according to embodiments herein.

Upon detecting a particular event associated with the power converters via feedback such as status information signal 125, IMON information, etc., the power supply monitor 141 generates a respective notification 150 to indicate the event associated with a specific one of the power converters. For example, in this example embodiment, assume that the power supply monitor 141 detects that the power converter 161 experiences an event such as a fault. In such an instance, the power supply monitor 141 generates the notification 150 (signal) to include a single rising and falling edge pair to indicate that the first power converter 161 experienced the event. Via the notification 150 in FIG. 4A, the remote management entity 142 is notified of the fault event (or other condition) associated with the first power converter 161.

FIG. 4B is an example diagram illustrating generate of a notification to indicate a fault condition associated with a second power converter according to embodiments herein.

Upon detecting a particular event associated with the power converters via feedback such as status information signal 125, IMON information, etc., the power supply monitor 141 generates a respective notification 150 to indicate the event associated with a specific one of the power converters.

For example, in this example embodiment, assume that the power supply monitor 141 detects that the power converter 162 experiences an event such as a fault. In such an instance, the power supply monitor 141 generates the notification 150 (signal) to include two pairs of rising and falling edges (one after the other) to indicate that the second power converter 162 experienced the event. Via the notification 150 in FIG. 4B, the remote management entity 142 is notified of the fault event (or other condition) associated with the power converter 162.

FIG. 4C is an example diagram illustrating generate of a notification to indicate a fault condition associated with a third power converter according to embodiments herein.

Upon detecting a particular event associated with the power converters via feedback such as status information signal 125, IMON information, etc., the power supply monitor 141 generates a respective notification 150 to indicate the event associated with a specific one of the power converters.

For example, in this example embodiment, assume that the power supply monitor 141 detects that the power converter 163 experiences an event such as a fault. In such an instance, the power supply monitor 141 generates the notification 150 (signal) to include three pairs if rising and falling edges (one after the other) to indicate that the second power converter 163 experienced the event. Via the notification 150 in FIG. 4C, the remote management entity 142 is notified of the fault event (or other condition) associated with the power converter 163.

FIG. 5A is an example diagram illustrating generate of a notification to indicate a fault condition associated with a second power converter according to embodiments herein.

Note further that the notification generated by the power supply monitor 141 or other suitable entity can be encoded in any suitable manner. For example, in one embodiment, the notification 150 can be generated to include a pulse width indicating attributes of the event (such as failure) associated with the power converters.

For example, the notification 150 in FIG. 5A is a signal having a rising edge followed by a falling edge, and in which a duration between the rising edge and the falling edge is a duration D1. In this example embodiment, the value of D1 is assigned to the power converter 161. In such an instance, the management entity 142 receives the notification 150, determines duration D1 from the received notification, and maps the detected duration D1 to an identity of the power converter 161.

As a further variation, note that the notification 150 can include any number or combination of edges, voltage magnitudes, etc., indicating the identity of the first power converter experiencing the event (failure) or other data associated with the detected event.

FIG. 5B is an example diagram illustrating generate of a notification to indicate a fault condition associated with a first power converter according to embodiments herein.

As a further example, the notification 150 in FIG. 5B is a signal having a rising edge followed by a falling edge, and in which a duration between the rising edge and the falling edge is a duration D2. In this example embodiment, the value of D2 is assigned to the power converter 162. In such an instance, the management entity 142 receives the notification 150 in FIG. 5B, determines the duration D2 associated with the notification, and maps the detected duration D2 to an identity of the power converter 162.

As previously discussed, as a further variation, note that the notification 150 can include any number or combination of edges, voltage magnitudes, etc., indicating the identity of the second power converter experiencing the event (failure)) or other data associated with the detected event.

FIG. 5C is an example diagram illustrating generate of a notification to indicate a fault condition associated with a third power converter according to embodiments herein.

As a further example, the notification 150 in FIG. 5C is a signal having a rising edge followed by a falling edge, and in which a duration between the rising edge and the falling edge is a duration D3. In this example embodiment, the value of D3 is assigned to the power converter 163. In such an instance, the management entity 142 receives the notification 150 in FIG. 5C, determines the duration D3, and maps the detected duration D3 to an identity of the power converter 163.

As previously discussed, as a further variation, note that the notification 150 can include any number or combination of edges, voltage magnitudes, etc., indicating the identity of the second power converter experiencing the event (failure)) or other data associated with the detected event.

Figure 6:
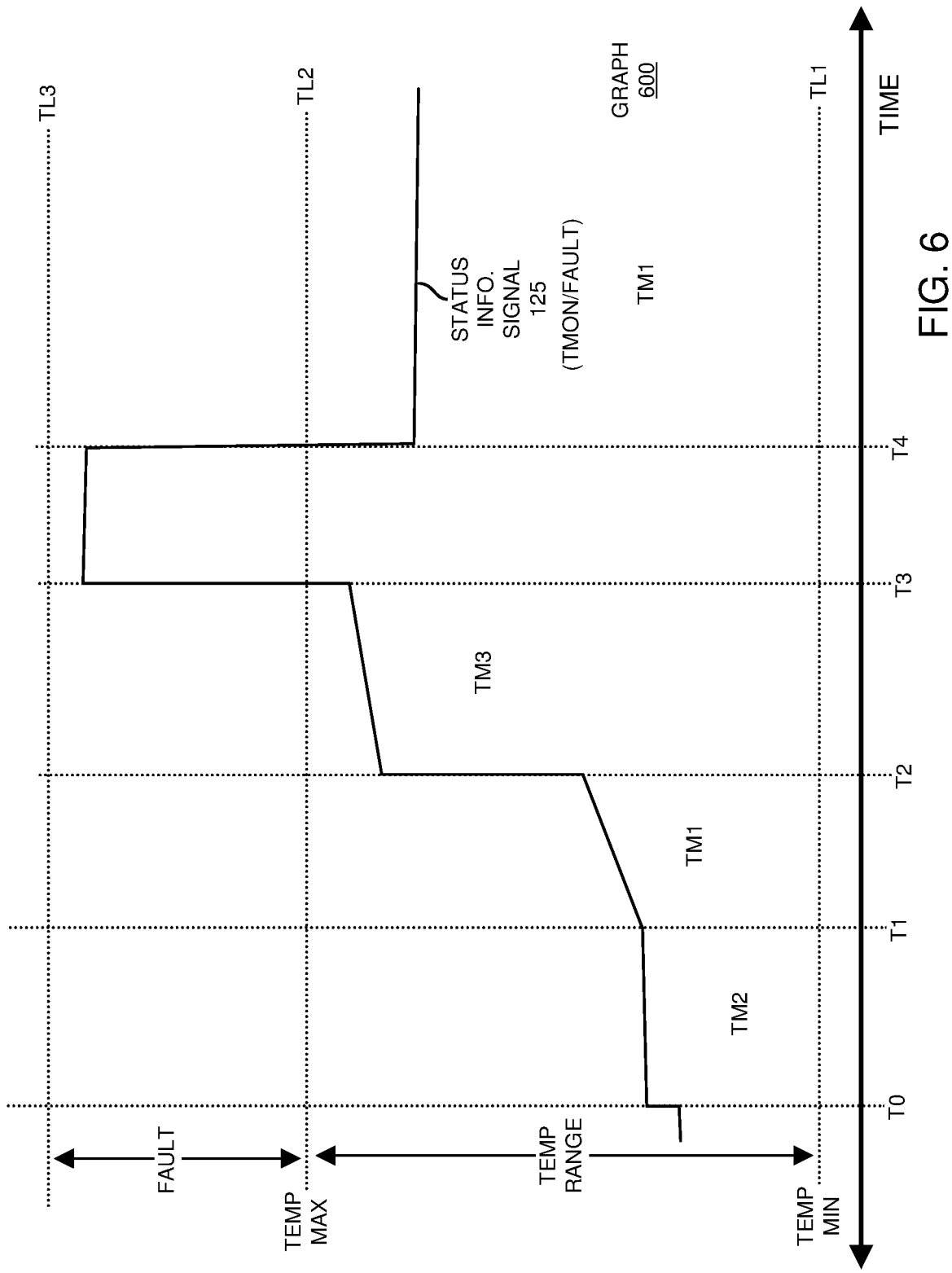
FIG. 6 is an example diagram illustrating implementation of a feedback signal (such as status information signal) to indicate different types of status information according to embodiments herein.

FIG. 6 is an example diagram illustrating implementation of a feedback signal to indicate different types of status information according to embodiments herein.

In this embodiment, the multiple voltage ranges associated with the status information signal 125 provide guidance as to what information is conveyed by the status information signal 125.

For example, the magnitude of the status information signal 125 between threshold level TL1 and threshold level TL2 indicates that the status information signal 125 represents a first parameter (such as such as the highest temperature of any of the power converters). The magnitude of the status information signal 125 between threshold level TL2 and threshold level TL3 indicates that the status information signal 125 represents a second parameter such as that the one of the multiple power converters experiences a respective failure.

In this example embodiment, assume that none of the power converters experiences a fault condition (respective fault monitors do not drive the status information signal 125 between time T0 and T3) and that the temperature monitor TM2 monitoring the power converter 162 detects a temperature of the power converter 162, which happens to be a highest temperature amongst all of the power converters. In such an instance, between time T0 and time T1, the temperature monitor TM2 drives the status information signal 125 with a voltage indicative of the temperature of the power converter 162.

As the temperature of the power converters changes over time as detected by the temperature monitors TM1, TM2, etc., the status information signal 125 represents a different temperature value.

For example, between time T1 and time T2, the temperature monitor TM1 detects the highest temperature; the status information signal 125 then conveys a voltage indicative of the temperature of the power converter 161.

Between time T2 and time T3, the temperature monitor TM3 detects the highest temperature; the status information signal 125 then conveys a voltage indicative of the temperature of the power converter 163.

Assume that the fault monitor F3 detects a fault condition at or around time T3. In response to detecting the fault condition associated with power converter 163, the fault monitor F3 drives the status information signal 125 to a voltage greater than threshold level TL2. The fault monitor F3 overrides the temperature information driven onto the status information signal 125 by the temperature monitors TM1, TM2, TM3, etc. In this example embodiment, because the fault monitor F3 drives the status information signal 125, the magnitude of the status information signal 125 is greater than the threshold level TL2 notifies the power supply monitor 141 that one of the power converters experiences a respective fault condition.

Thus, the first status of the status information signal 125 prior to the failure before time T3 and after time T4 is indicative of a magnitude of a first parameter (such as temperature) or other suitable power supply parameter. The second status of the status information signal 125 during the failure between time T3 and T4 is indicative that a failure occurs. As further discussed below, in one embodiment, the power supply monitor 141 uses the current feedback information (IMONX-Y) stored in the buffers BX-Y to determine which of the power converters experiences the failure.

Assume that the detected fault condition is corrected (or expires) at time T4. In such an instance, after time T4, the temperature monitor TM1 drives the status information signal 125 with a voltage magnitude indicative of a detected temperature of the power converter 161.

In one embodiment, each of the temperature monitors TM1, TM2, TM3, etc., drive the status information signal 125. As previously discussed, the status information signal 125 indicates the highest temperature of the multiple temperature monitors driving the status information signal 125.

FIG. 7 is an example diagram illustrating a power supply monitor and absence of generating notification of a fault condition according to embodiments herein.

As previously discussed, in one embodiment, the status information signal 125 itself does not indicate which of the multiple power converters experiences a respective failure. For example, assume that the power supply monitor 141 also receives status information (IMON) indicating a magnitude of the current supplied by each of the power converter phases to the load 118. The controller 140 includes buffers to store the output current from each phase.

More specifically, as previously discussed, the buffer B1-1 stores a magnitude of the output current (22 Amps) supplied by the power converter phase 161-1 of the power converter 161 to the load 118; the buffer B1-2 stores a magnitude of the output current (23 Amps) supplied by the power converter phase 161-2 of the power converter 161 to the load 118; the buffer B1-3 stores a magnitude of the output current (21 Amps) supplied by the power converter phase 161-3 of the power converter 161 to the load 118; and so on.

The buffer B2-1 stores a magnitude of the output current (32 Amps) supplied by the power converter phase 162-1 of the power converter 162 to the load 118; the buffer B2-2 stores a magnitude of the output current (30 Amps) supplied by the power converter phase 162-2 of the power converter 162 to the load 118; the buffer B2-3 stores a magnitude of the output current (31 Amps) supplied by the power converter phase 162-3 of the power converter 162 to the load 118; and so on.

The buffer B3-1 stores a magnitude of the output current (12 Amps) supplied by the power converter phase 163-1 of the power converter 163 to the load 118; the buffer B3-2 stores a magnitude of the output current (11 Amps) supplied by the power converter phase 163-2 of the power converter 163 to the load 118; the buffer B3-3 stores a magnitude of the output current (13 Amps) supplied by the power converter phase 163-3 of the power converter 163 to the load 118; and so on.

Assume in this example embodiment that the acceptable range of output current is between 0 and 40 Amps. In such an instance, none of the power converters experiences a failure condition in FIG. 7. In such an instance, the power supply monitor 141 produces the notification 150 (signal) to indicate no failure to the management entity 142. For example, as shown in FIG. 6, the status information signal 125 conveys the temperature associated with the power converter 163 to the power supply monitor 141.

Figure 8:
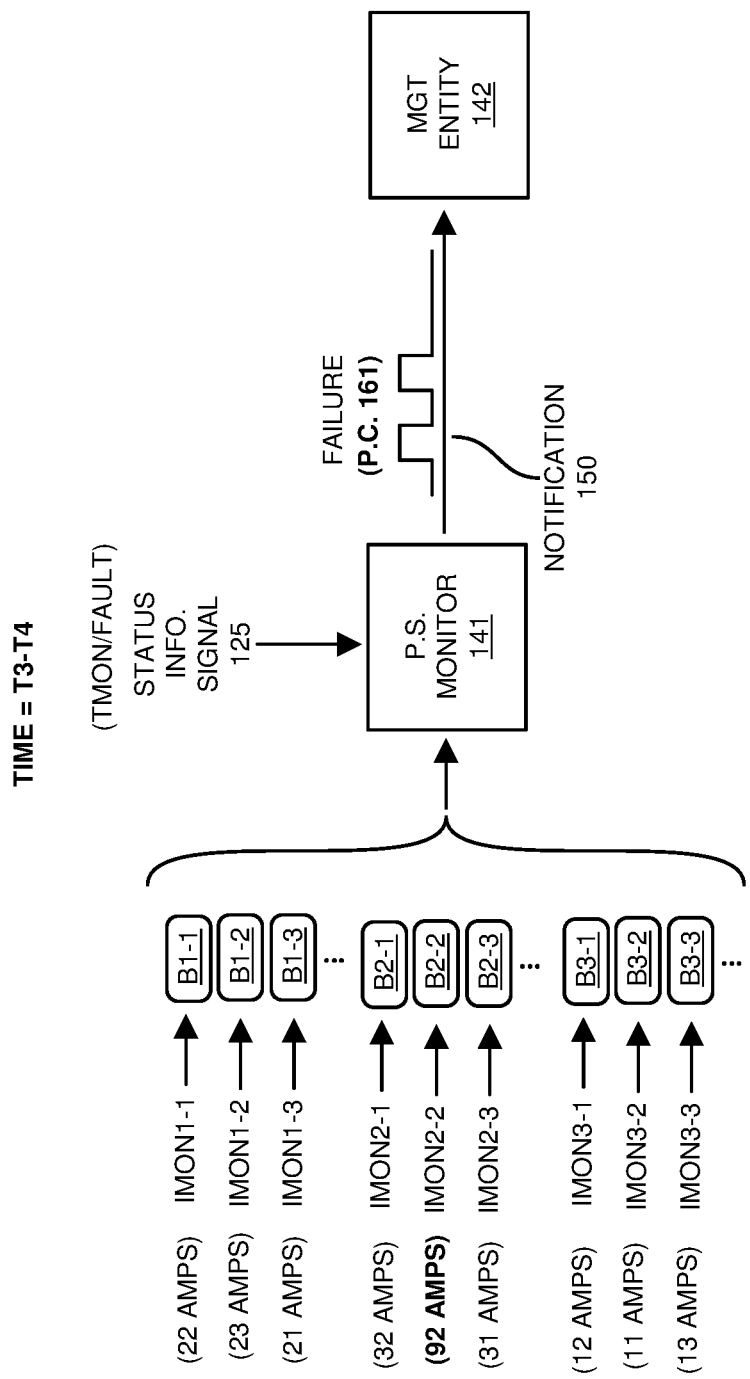
FIG. 8 is an example diagram illustrating a power supply monitor and generation of a notification indicating a fault condition associated with a second power converter according to embodiments herein.

FIG. 8 is an example diagram illustrating a power supply monitor and generation of a notification indicating a fault condition associated with a second power converter according to embodiments herein.

In this example embodiment, the buffer B1-1 stores a magnitude of the output current (22 Amps) supplied by the power converter phase 161-1 of the power converter 161 to the load 118; the buffer B1-2 stores a magnitude of the output current (23 Amps) supplied by the power converter phase 161-2 of the power converter 161 to the load 118; the buffer B1-3 stores a magnitude of the output current (21 Amps) supplied by the power converter phase 161-3 of the power converter 161 to the load 118; and so on.

The buffer B2-1 stores a magnitude of the output current (32 Amps) supplied by the power converter phase 162-1 of the power converter 162 to the load 118; the buffer B2-2 stores a magnitude of the output current (92 Amps) supplied by the power converter phase 162-2 of the power converter 162 to the load 118; the buffer B2-3 stores a magnitude of the output current (31 Amps) supplied by the power converter phase 162-3 of the power converter 162 to the load 118; and so on.

The buffer B3-1 stores a magnitude of the output current (12 Amps) supplied by the power converter phase 163-1 of the power converter 163 to the load 118; the buffer B3-2 stores a magnitude of the output current (11 Amps) supplied by the power converter phase 163-2 of the power converter 163 to the load 118; the buffer B3-3 stores a magnitude of the output current (13 Amps) supplied by the power converter phase 163-3 of the power converter 163 to the load 118; and so on.

Assume in this example embodiment that the acceptable range of output current is between 0 and 40 Amps. In such an instance, the power supply monitor 141 determines that the second power converter experiences a respective failure because the output current value in buffer 2-2 is 92 Amps, which is an over-current fault condition falling outside the range 0 to 40 Amps. In response to detecting the over current condition, the power supply monitor 141 produces the notification 150 (signal) to indicate that the power converter 162 experiences a respective failure because the over condition is associated with the power converter phase 162-2 in power converter 162.

Figure 9:
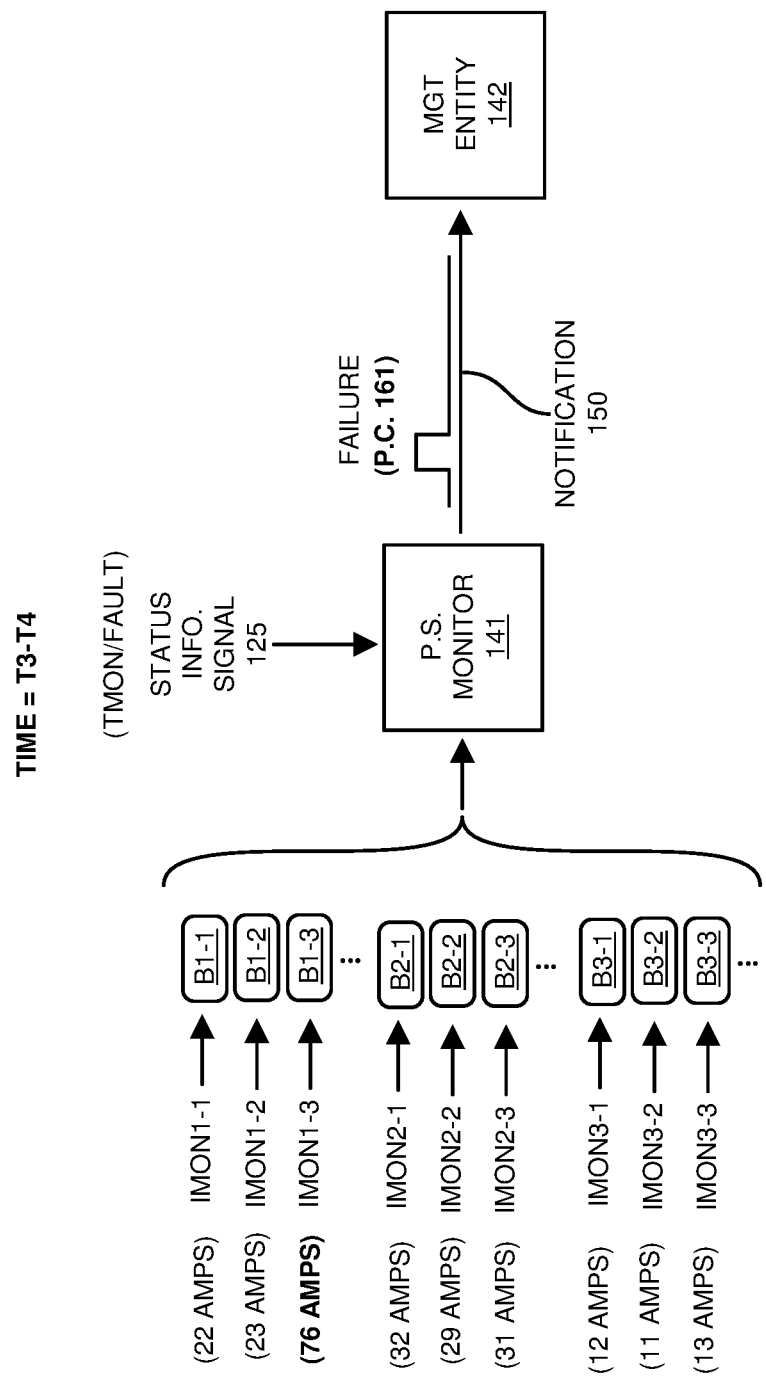
FIG. 9 is an example diagram illustrating a power supply monitor and generation of a notification indicating a fault condition associated with a first power converter according to embodiments herein.

Thus, in addition to the status information signal 125, the power supply monitor 141 receives additional input such as current monitor feedback information stored in respective buffers as previously discussed. In one embodiment, in response to detecting that the magnitude of the status information signal 125 is greater than the threshold level TL2 indicating a failure condition between time T3 and time T4 of FIG. 6, the power supply monitor 141 uses the supplemental feedback (such as IMON information stored in respective buffers) to determine which of the power converters experiences the failure. In the case of FIG. 9, the power supply monitor 141 detects that the power converter 162 experiences a respective failure because of the detected over current (stored in buffer B2-2, 92 Amps) associated with the power converter phase 162-2. In response to such a condition, the power supply monitor 141 produces notification 150 indicating the failure associated with the power converter 162. In one embodiment, in response to receiving the notification 150, the management entity 142 proactively terminates operation of the power converter 162 and/or power converter phase 162-2.

FIG. 9 is an example diagram illustrating a power supply monitor and generation of a notification indicating a fault condition associated with a first power converter according to embodiments herein.

In this example embodiment, the buffer B1-1 stores a magnitude of the output current (22 Amps) supplied by the power converter phase 161-1 of the power converter 161 to the load 118; the buffer B1-2 stores a magnitude of the output current (23 Amps) supplied by the power converter phase 161-2 of the power converter 161 to the load 118; the buffer B1-3 stores a magnitude of the output current (76 Amps) supplied by the power converter phase 161-3 of the power converter 161 to the load 118; and so on.

The buffer B2-1 stores a magnitude of the output current (32 Amps) supplied by the power converter phase 162-1 of the power converter 162 to the load 118; the buffer B2-2 stores a magnitude of the output current (29 Amps) supplied by the power converter phase 162-2 of the power converter 162 to the load 118; the buffer B2-3 stores a magnitude of the output current (31 Amps) supplied by the power converter phase 162 3 of the power converter 162 to the load 118; and so on.

The buffer B3-1 stores a magnitude of the output current (12 Amps) supplied by the power converter phase 163-1 of the power converter 163 to the load 118; the buffer B3-2 stores a magnitude of the output current (11 Amps) supplied by the power converter phase 163-2 of the power converter 163 to the load 118; the buffer B3-3 stores a magnitude of the output current (13 Amps) supplied by the power converter phase 163 3 of the power converter 163 to the load 118; and so on.

Assume in this example embodiment that the acceptable range of output current is between 0 and 40 Amps. In such an instance, the power supply monitor 141 determines that the first power converter 161 experiences a respective failure because the output current value in buffer B1-3 is 76 Amps, which is an over-current fault condition falling outside the range 0 to 40 Amps. In response to detecting the over current condition, the power supply monitor 141 produces the notification 150 (signal) to indicate that the power converter 161 experiences a respective failure because the detected over current condition is associated with the power converter phase 161-3 in power converter 161.

Thus, in addition to the status information signal 125, the power supply monitor 141 receives additional input such as current monitor feedback information stored in respective buffers. In one embodiment, in response to detecting that the magnitude of the status information signal 125 is greater than the threshold level TL2 indicating a failure condition, the power supply monitor 141 uses the supplemental feedback (such as IMON information stored in respective buffers) to determine which of the power converters experiences the failure. In the case of FIG. 9, the power supply monitor 141 detects that the power converter 161 experiences a respective failure because of the detected over current (stored in buffer B1-3, 76 Amps) associated with the power converter phase 161-3. In response to such a condition, the power supply monitor 141 produces notification 150 indicating the failure associated with the power converter 161. In one embodiment, in response to receiving the notification 150, the management entity 142 proactively terminates operation of the power converter 161 and/or power converter phase 161-3.

Figure 10:
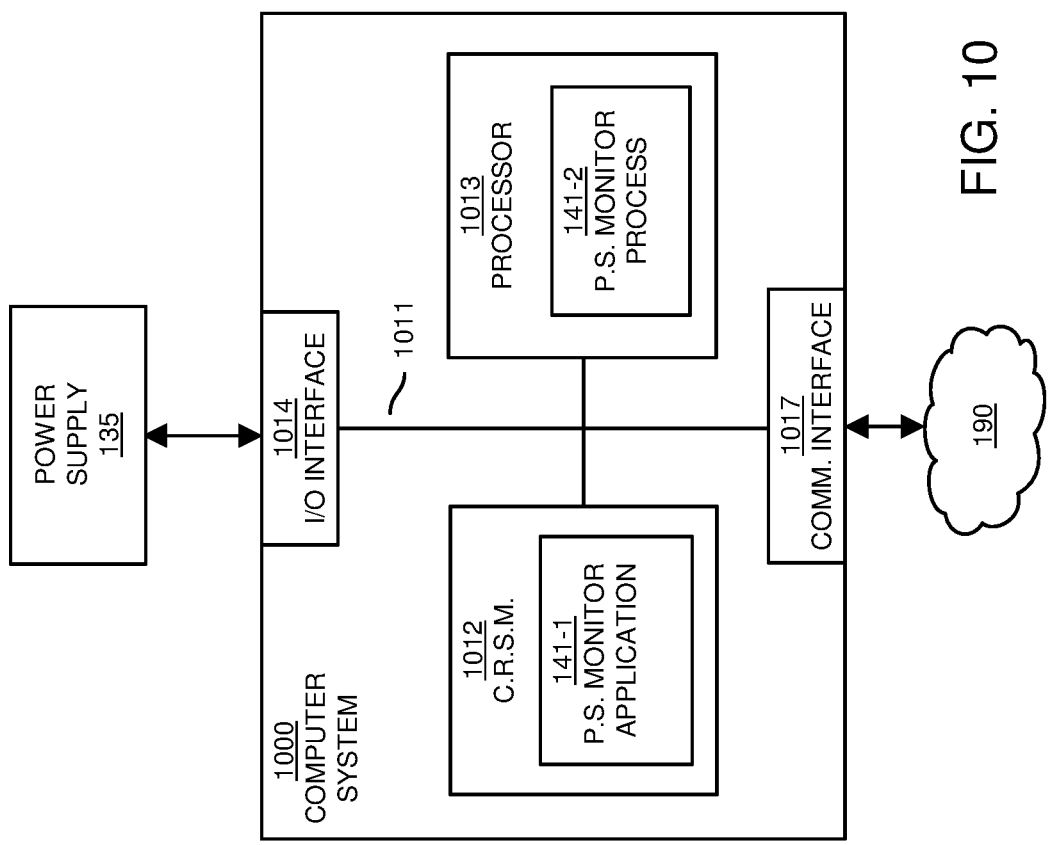
FIG. 10 is an example diagram illustrating computer processor hardware and related software instructions that execute methods according to embodiments herein.

FIG. 10 is an example block diagram of a computer system for implementing any of the operations as previously discussed according to embodiments herein.

Any of the resources (such as power supply monitor 141, controller 140, management entity 142, etc.) as discussed herein can be configured to include computer processor hardware and/or corresponding executable instructions to carry out the different operations as discussed herein.

For example, as shown, computer system 1000 of the present example includes an interconnect 1011 that couples computer readable storage media 1012 such as a non-transitory type of media (which can be any suitable type of hardware storage medium in which digital information can be stored and retrieved), a processor 1013 (computer processor hardware), I/O interface 1014, and a communications interface 1017.

I/O interface(s) 1014 supports connectivity to switches S0 and S1.

Computer readable storage medium 1012 can be any hardware storage device such as memory, optical storage, hard drive, floppy disk, etc. In one embodiment, the computer readable storage medium 1012 stores instructions and/or data.

As shown, computer readable storage media 1012 can be encoded with power supply monitor application 140-1 (e.g., including instructions) to carry out any of the operations as discussed herein.

During operation of one embodiment, processor 1013 accesses computer readable storage media 1012 via the use of interconnect 1011 in order to launch, run, execute, interpret or otherwise perform the instructions in power supply monitor application 140-1 stored on computer readable storage medium 1012. Execution of the power supply monitor application 140-1 produces power supply monitor process 140-2 to carry out any of the operations and/or processes as discussed herein.

Those skilled in the art will understand that the computer system 1000 can include other processes and/or software and hardware components, such as an operating system that controls allocation and use of hardware resources to execute power supply monitor application 140-1.

In accordance with different embodiments, note that computer system may reside in any of various types of devices, including, but not limited to, a power supply, switched-capacitor converter, power converter, a mobile computer, a personal computer system, a wireless device, a wireless access point, a base station, phone device, desktop computer, laptop, notebook, netbook computer, mainframe computer system, handheld computer, workstation, network computer, application server, storage device, a consumer electronics device such as a camera, camcorder, set top box, mobile device, video game console, handheld video game device, a peripheral device such as a switch, modem, router, set-top box, content management device, handheld remote control device, any type of computing or electronic device, etc. The computer system 1050 may reside at any location or can be included in any suitable resource in any network environment to implement functionality as discussed herein.

Functionality supported by the different resources will now be discussed via flowchart in FIG. 11. Note that the steps in the flowchart below can be executed in any suitable order.

Figure 11:
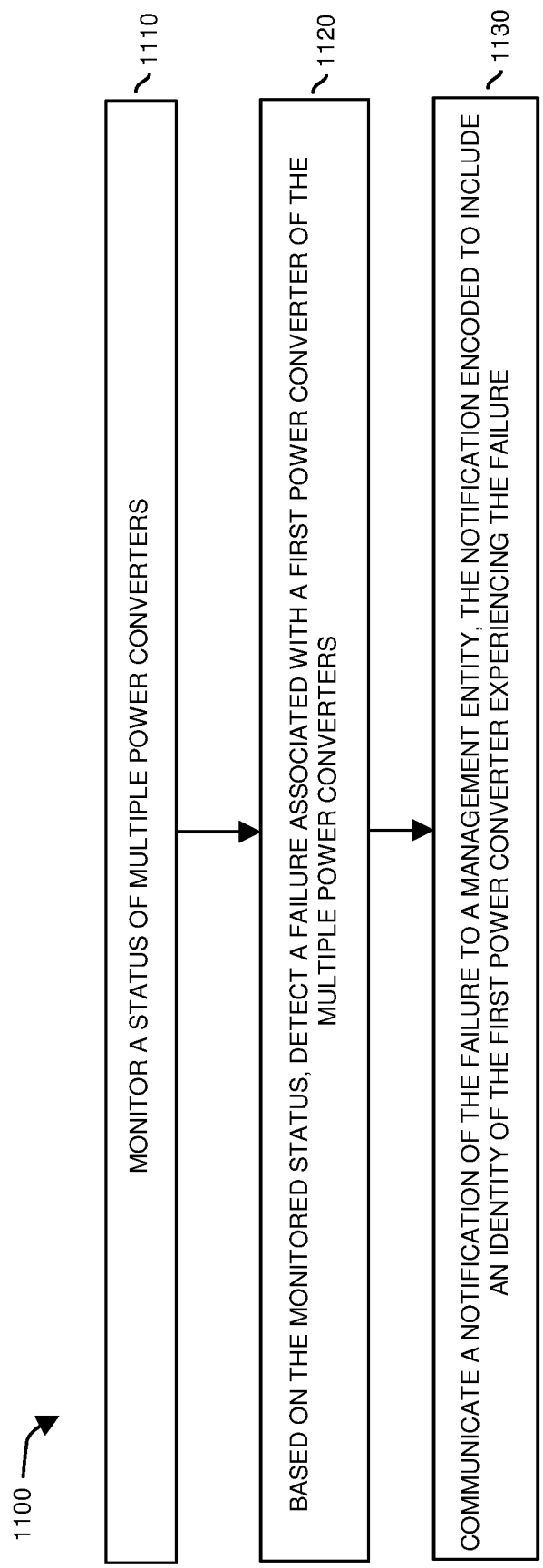
FIG. 11 is an example diagram illustrating a method according to embodiments herein.

FIG. 11 is a flowchart 1100 illustrating an example method according to embodiments herein. Note that there will be some overlap with respect to concepts as discussed above.

In processing operation 1110, the power supply monitor 141 monitors a status of multiple power converters 161, 162, 163, etc.

In processing operation 1120, based on the monitored status, the power supply monitor 141 detects a failure associated with a first power converter 161 of the multiple power converters.

In processing operation 1130, the power supply monitor 141 communicates a notification 150 of the failure to a management entity 142. In one embodiment, the notification 150 is encoded to include an identity of the first power converter 161 experiencing the failure.

Figure 12:
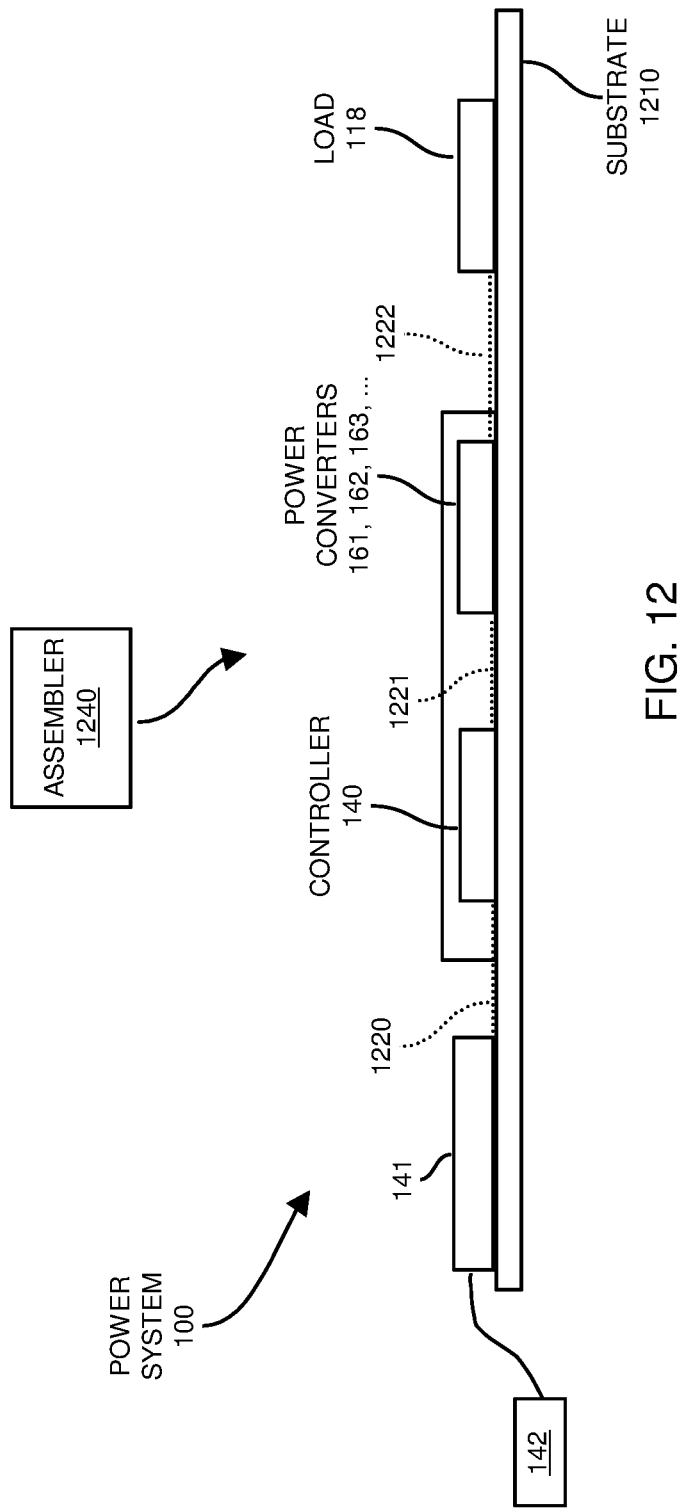
FIG. 12 is an example diagram illustrating fabrication of a circuit according to embodiments herein.

FIG. 12 is an example diagram illustrating assembly of a circuit board including a current monitor and power supply monitor according to embodiments herein.

In this example embodiment, assembler 1240 (a.k.a., fabricator) receives a substrate 1210 (such as a circuit board).

The assembler 1240 (fabricator) affixes (couples) the components of power system 100 (such as including controller 140, power supply monitor 141, power converter phases 161, 162, 163, etc.) to the substrate 1210. As previously discussed, the power supply monitor 141 can be included in controller 140 or implemented as a separate entity (such as circuit). One or more circuit paths 1220 provide connectivity between the power supply monitor 141 and the controller 140. One or more circuit paths 1221 provide connectivity between the controller 140 and the power converters 161, 162, 163, etc.

Via one or more circuit paths 1222 (such as one or more traces, electrical conductors, cables, wires, etc.), the assembler 1240 or other suitable entity couples the power converters to the load 118. The one or more circuit paths convey output voltages 123-1, 123-2, 123-3, etc., to the dynamic load 118.

Note that components associated with the power system 100 such as the controller 140, power converters, power supply monitor 141, etc., can be affixed or coupled to the substrate 1210 in any suitable manner. For example, each of the one or more of the components in power system 100 can be soldered to the substrate, inserted into one or more respective sockets on the substrate 1210, etc.

Note further that the substrate 1210 is optional. If desired, the components of power system 100 and corresponding circuit paths can be disposed in cables or other suitable resource.

As previously discussed, via one or more circuit paths 1222 (such as one or more traces, cables, connectors, wires, conductors, electrically conductive paths, etc.), the assembler 1240 provides connectivity of the power supply 100 to the load 118. In one embodiment, the circuit paths 1222 convey the output voltages 123-1, 123-2, 123-3, etc., from the power converters to the load 118.

Accordingly, embodiments herein include a system comprising: a substrate 1210 (such as a circuit board, standalone board, mother board, standalone board destined to be coupled to a mother board, host, etc.); a power system 100 including corresponding components as described herein; and a load 118. As previously discussed, the load 118 is powered based on conveyance of the output voltage 129 over one or more paths 1222.

Note that the load 118 can be any suitable circuit or hardware such as one or more CPUs (Central Processing Units), GPUs (Graphics Processing Unit) and ASICs (Application Specific Integrated Circuits such those including one or more Artificial Intelligence Accelerators), which can be located on the substrate 1010 or disposed at a remote location.

Note again that techniques herein are well suited for use in power supply applications and monitoring of respective power converters to provide status notifications to a remote management entity. However, it should be noted that embodiments herein are not limited to use in such applications and that the techniques discussed herein are well suited for other applications as well.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

The invention claimed is:

1. An apparatus comprising:
a power supply monitor operative to:
 receive a first input signal;
 monitor a status of multiple power converters based on a magnitude of the first input signal;
 detect occurrence of an event associated with a first power converter of the multiple power converters based on detecting that the magnitude of the first input signal falls within a first range of multiple ranges; and
 communicate a notification of the event to a remote management entity, the notification encoded to include an identity of the first power converter experiencing the event.

2. The apparatus as in claim 1, wherein a pulse width of the notification indicates attributes of the event associated with the first power converter.

3. The apparatus as in claim 2, wherein the first input signal is not encoded to indicate that the first power converter experienced the event; and
wherein the power supply monitor is operative to analyze feedback generated by each of the multiple power converters to determine that the first power converter experienced the event.

4. The apparatus as in claim 1, wherein the event is a fault caused by failure of a power converter phase in the first power converter.

5. The apparatus as in claim 1, wherein the first input signal indicates a status of a second power converter of the multiple power converters prior to the occurrence of the event.

6. The apparatus as in claim 1, wherein a magnitude setting of the first input signal is collectively controlled over time by each of the multiple power converters to provide the status of the multiple power converters to the power supply monitor, the magnitude of the first input signal varying over time depending on a collective status of the multiple power converters.

7. The apparatus as in claim 6, wherein the power supply monitor is further operative to:
receive first feedback from the first power converter, the first feedback being independent with respect to the first input signal and indicating a first current consumption status associated with the first power converter; and receive second feedback from a second power converter of the multiple power converters, the second feedback being independent with respect to the first input signal and indicating a second current consumption status, the second current consumption status associated the second power converter.

8. The apparatus as in claim 7, wherein the first input signal is indicative of a magnitude of a temperature prior to the event.

9. The apparatus as in claim 1, wherein a setting of the magnitude of the received first input signal is collectively controlled and generated by the multiple power converters over time to provide the status of the multiple power converters.

10. The apparatus as in claim 1, wherein the first input signal is a multi-purpose feedback signal; and
wherein the power supply monitor is further operative to monitor the status of the multiple power converters via the multi-purpose feedback signal, a setting of the received multi-purpose feedback signal indicative of a first status associated with the multiple power converters prior to the event and a second status associated with the multiple power converters subsequent to the occurrence of the event.

11. A system comprising:
a circuit substrate; and
the apparatus of claim 1, the apparatus coupled to the circuit substrate.

12. A method comprising:
receiving a circuit substrate; and
coupling the apparatus of claim 1 to the circuit substrate.

13. The apparatus as in claim 1, wherein the multiple ranges include the first range and a second range, the power supply monitor further operative to:
detect non-occurrence of the event associated with the first power converter based on the magnitude of the first input signal falling within the second range prior to detection of the magnitude of the first input signal falling within the first range.

14. The apparatus as in claim 13, wherein the magnitude of the first input signal falling within the second range is generated by a second power converter of the multiple power converters; and
wherein the magnitude of the first input signal falling within the second range indicates a measurement value associated with the second power converter.

15. The apparatus as in claim 14, wherein the measurement value represents a maximum measurement value amongst multiple measurement values associated with the multiple power converters.

16. The apparatus as in claim 1, wherein the magnitude of the first input signal falls within the first range for a first time duration during which the first power converter experiences the event.

17. The apparatus as in claim 16, wherein the multiple ranges include a second range; and
wherein the magnitude of the first input signal falls within the second range for a second time duration prior to the first time duration, the magnitude of the first input signal falling within the second range indicating non-occurrence of the event associated with the first power converter during the second time duration.

18. The apparatus as in claim 17, wherein the second range is a temperature range;
wherein the magnitude of the first input signal falling in the second range during the second time duration indicates a temperature associated with one of the multiple power converters; and
wherein the event is a fault condition; and
wherein occurrence of the magnitude of the first input signal in the first range is indicative of the fault condition.

19. The apparatus as in claim 1, wherein the power supply monitor is further operative to:
access status information associated with the multiple power converters in response to detecting that the magnitude of the first input signal falls within the first range of the multiple ranges; and
from the accessed status information, determine that the first power converter experienced the event.

20. The apparatus as in claim 1, wherein the magnitude of the first input signal varies over time based on a respective status of the multiple power converters;
wherein the magnitude of the first input signal falls within the first range of the multiple ranges at a first instant of time and
wherein the magnitude of the first input signal falls outside of the first range of the multiple ranges for a second instant of time, the magnitude of the first input signal falling outside the first range indicating non-occurrence of the event.

21. The apparatus as in claim 1, wherein setting of the magnitude of the first input signal is controlled at different times by each of the multiple power converters to provide the status of the multiple power converters to the power supply monitor.

22. The apparatus as in claim 1, wherein the multiple power converters include the first power converter and a second power converter;
wherein each of the multiple power converters sets the magnitude of the first input signal at different times in a second range of the multiple ranges during monitoring of the first input signal by the power supply monitor.

23. The apparatus as in claim 1, wherein detection of the event by the first power converter causes the first power converter to set the magnitude of the first input signal to fall within the first range in response to the first power converter experiencing the event.

24. A method comprising:
via a power supply monitor:
receiving a first input signal;
monitoring a status of multiple power converters based on a magnitude of the first input signal;
detecting an event associated with a first power converter of the multiple power converters based on detecting that the magnitude of the first input signal falls within a first range of multiple ranges, the magnitude of the first input signal controlled by each of the multiple power converters at different times to provide the status of the multiple power converters to the power supply monitor; and
communicating a notification of the event to a remote management entity, the notification encoded to include an identity of the first power converter experiencing the event.

25. The method as in claim 24, wherein the monitored status indicates that one of the multiple power converters experiences the event.

26. The method as in claim 24, wherein a pulse width of the notification indicates attributes of the event associated with the first power converter.

27. The method as in claim 26, wherein the monitored status does not indicate that the first power converter experienced the event.

28. The method as in claim 24, wherein the event is a fault caused by a power converter phase in the first power converter.

29. The method as in claim 24 further comprising:
in addition to receiving the first input signal:
receiving first feedback from the first power converter, the first feedback indicating a first current consumption status, the first current consumption status associated the first power converter; and
receiving second feedback from the second power converter, the second feedback indicating a second current consumption status, the second current consumption status associated the second power converter.

30. The method as in claim 29, wherein the first input signal is indicative of a magnitude of a temperature prior to the event; and
wherein the event is not related to temperature.

31. The method as in claim 24, wherein the first input signal is a multi-purpose feedback signal, the method further comprising:
monitoring the status via the multi-purpose feedback signal, a setting of the received feedback signal indicative of a first status associated with the multiple power converters prior to the event and a second status associated with the multiple power converters during the event.

32. Computer-readable storage hardware having instructions stored thereon, the instructions, when executed by computer processor hardware, cause the computer processor hardware to:
receive a first input signal;
monitor a status of multiple power converters based on a magnitude of the first input signal;
detect occurrence of an event associated with a first power converter of the multiple power converters based on detecting that the magnitude of the first input signal falls within a first range of multiple ranges; and
communicate a notification of the event to a remote management entity, the notification encoded to include an identity of the first power converter experiencing the event.

* * * * *